Aug. 14, 1956 A. M. SKELLETT 2,759,104
MULTIVIBRATOR OSCILLATOR GENERATOR
Filed May 20, 1953 2 Sheets-Sheet 1

INVENTOR.
ALBERT M. SKELLETT
BY
John J. Rogan
ATTORNEY

INVENTOR.
ALBERT M. SKELLETT
BY John J. Rogan
ATTORNEY

United States Patent Office 2,759,104

Patented Aug. 14, 1956

2,759,104

MULTIVIBRATOR OSCILLATOR GENERATOR

Albert M. Skellett, Madison, N. J., assignor to National Union Electric Corporation, a corporation of Delaware Application May 20, 1953, Serial No. 356,258

8 Claims. (Cl. 250—36)

This invention relates to oscillator generators and more especially it relates to oscillators of the transistor type.

A principal object of the invention is to provide an improved multivibrator oscillator employing a pair of transistors and associated interconnecting circuits.

Another object is to employ a multivibrator oscillator generator employing a pair of transistors having grounded emitter electrodes.

A feature of the invention relates to a multivibrator oscillator generator employing a pair of transistors whose base electrodes and whose collector electrodes are cross-connected and with the base electrodes returned in parallel to ground through an inductance whereby sustained oscillations are generated.

Another feature relates to an improved oscillator generator employing a pair of transistors with associated cross-connections and feed back circuits, whereby both sinusoidal and substantially square topped waves are simultaneously obtainable.

A further feature relates to an oscillator generator employing a pair of transistors having their base electrodes returned in parallel to ground through respective time-constant circuits, and whose emitter electrodes are substantially directly grounded.

A still further feature relates to the novel organization, arrangement and relative interconnection of parts which cooperate to provide an economical, efficient transistor oscillator generator requiring a single low voltage biasing potential.

Other features and advantages not specifically enumerated will be apparent after a consideration of the following detailed descriptions and the appended claims.

Figure 1:
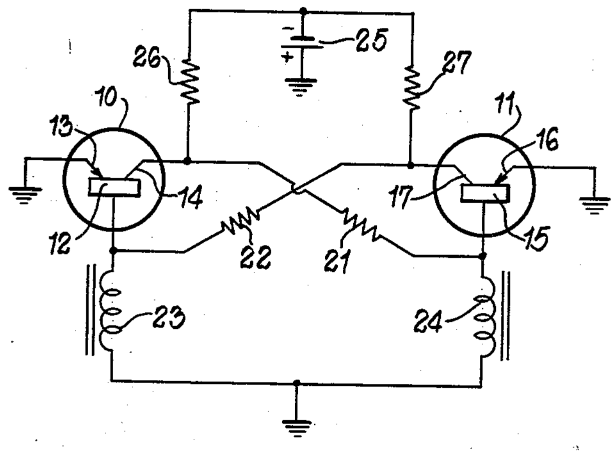
Fig. 1 is a schematic wiring diagram of a transistor multivibrator generator according to the invention.
Figure 1A:
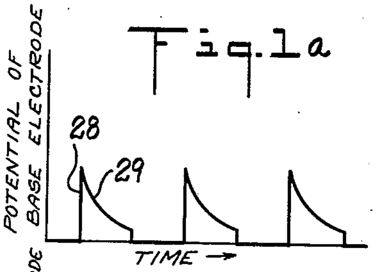
Figure 1B:
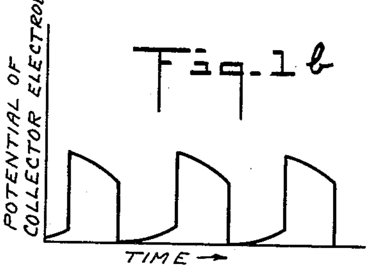
Figure 3:
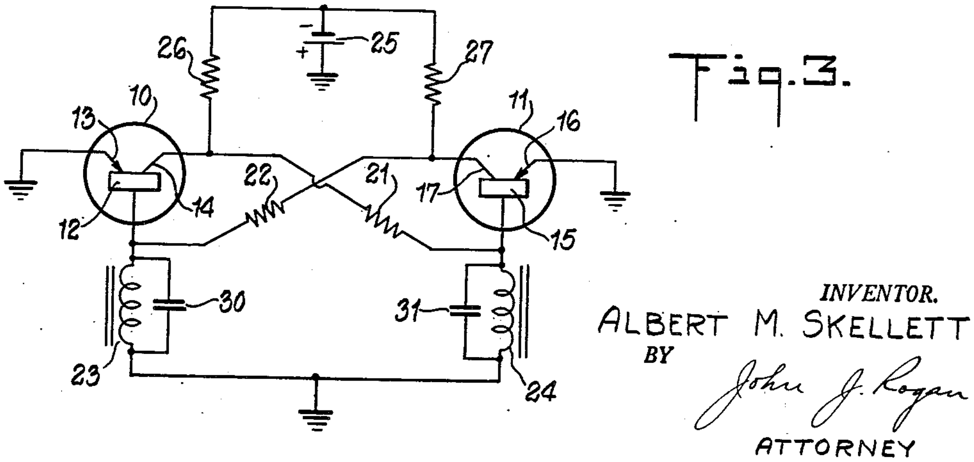
Figures 3A, 3B, 4, 5, 6, 7, 8, 9:
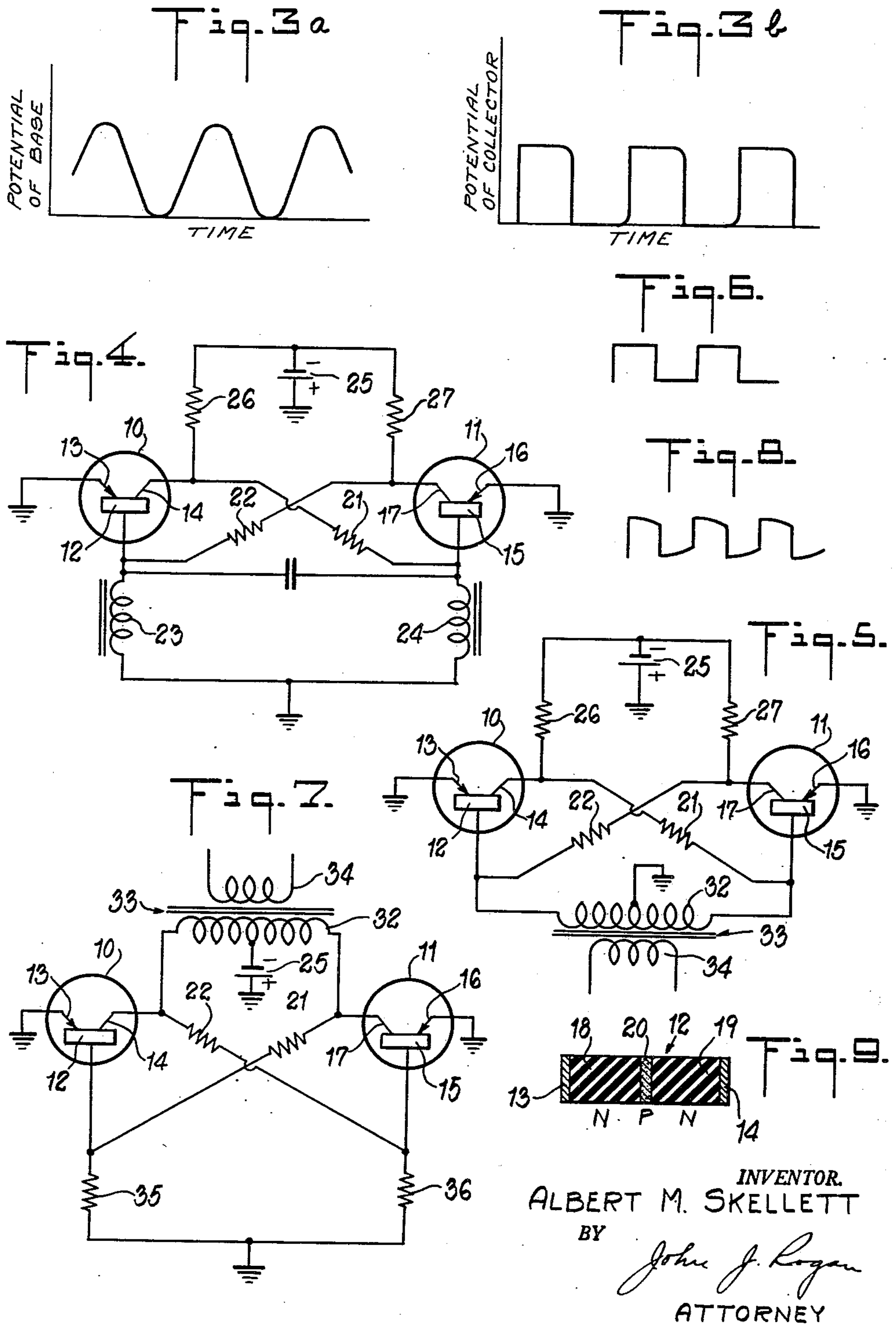

Figs. 1*a* and 1*b* are respective diagrams of sustained waves obtained from the system of Fig. 1;

Fig. 3 is a further modification of Fig. 1;

Figs. 3*a* and 3*b* are respective wave diagrams showing the sinusoidal and square topped waves generated by the system of Fig. 3;

Fig. 4 is a further modification of Fig. 1;

Fig. 5 is a still further modification of the invention;

Fig. 6 is a wave diagram showing the type of waves generated by the system of Fig. 5;

Fig. 7 is a still further modification of the invention;

Fig. 8 is a wave diagram showing the type of wave obtainable with the system of Fig. 7;

Fig. 9 is a schematic diagram of a multiple junction type transistor that may be used with the invention.

The present invention is based upon the fact that transistors are in reality current operated devices in contrast with grid controlled vacuum tubes which are essentially voltage operated devices. Referring to Fig. 1, the numerals 10 and 11 represent any well known form of transistor. As is well known in the transistor art, each transistor comprises a base electrode, an emitter electrode, and a collector electrode. The base electrode of transistor 10 is designated 12; the emitter electrode is designated 13; and the collector electrode is designated 14. Likewise, the transistor 11 has a base electrode 15, an emitter electrode 16, and a collector electrode 17. It will be understood, however, that the showing of the transistor in Fig. 1 of the drawing is essentially schematic and is intended to include also transistors of the junction or multiple junction type.

Referring to Fig. 1, the emitter electrode 13 of transistor 10 and the emitter electrode 16 of transistor 11 are directly grounded. The collector electrode 14 is cross-connected through a resistor 21 to the base electrode 15. Likewise, the collector electrode 17 is cross connected through a similar resistor 22 to the base electrode 12. The base electrode 12 is returned to ground through an inductance coil 23 and the base electrode 15 is also returned to ground through a similar inductance coil 24. The collector electrodes 14 and 17 are negatively biased with respect to ground by a suitable low voltage direct current source, such as battery 25, whose positive terminal is grounded and whose negative terminal is connected in parallel through similar resistors 26, 27 to the respective collector electrodes 14 and 17. With this circuit arrangement the base electrodes 12 and 15 constitute the control elements of the system and their potential varies with respect to ground in such a way as to maintain the system in continuous oscillation.

The potential of battery 25 is chosen so that to a certain extent the transistors 10 and 11 act as amplifiers. If both transistors are operated with the same currents and the same potentials, the circuit acts in the nature of a two stage transistor amplifier having the emitter electrodes grounded and wherein the output of the second transistor 11 is fed back to the input of the first transistor 10.

Because of this arrangement the system is in an unstable condition. Assume, for example, that the current through the inductance 23 starts to increase. This will cause an increase in the current at collector electrode 14. The net result is that the potential at collector electrode 14 will be driven more positive in potential. This positive swing in voltage of the electrode 14 decreases the current flowing between the collector 14 through the resistor 21 to the inductance 24 to ground. The resulting decrease of current through the base electrode return circuit of transistor 11 will, in turn, decrease the current to the collector electrode 17. This increases the negative potential and provides the opposite type of action through the inductance 23 and increases the current flow through it. This further increase in current flow through inductance 23 will serve to increase that current even further. The net result is a regenerative action in the system and when the regeneration increases to a certain point the current through inductance 24 will be cut off. When this happens the regenerative action will also cease because transistor 11 becomes inoperative and the current through inductance 23 will start to decay until the current conditions are brought back to the point where both transistors are able to amplify and transistor 11 is no longer cut off. The current through the inductance 23 will continue to decrease. The regenerative action above described will continue to drive this current to zero, while driving the current through inductance 24 to a maximum value.

Thus, the oscillating cycle will be repeated back and forth between the base electrodes 12 and 15. The periodicity of this oscillation will be dependent upon the values of the inductances 23, 24, and the effective or equivalent resistance across those inductances, according to the well-known law $T=L/R$, wherein T is the time constant of the circuit, L is the inductance of either coil 23 or coil 24, and R is the equivalent resistance across these inductances. Thus, by proper proportioning of the value of the inductances 23, 24, with respect to the resistors 21, 22, and 26, 27, the system may be made to oscillate at the desired frequency.

Fig. 1*a* shows the wave form of the voltage variation of either base electrode with respect to ground, as viewed on an oscilloscope. It should be observed that the wave shape of Fig. 1*a* is a typical multivibrator wave shape which is rich in harmonics of a fundamental frequency. Each wave has a relatively sharply rising leading edge 28 and a smoothly decaying control edge 29, which again sharply drops to zero, or the base potential of the system. Fig. 1*b* shows the wave form of the potential variation of either collector electrode with respect to ground, this wave shape approaching a substantially square wave. A comparison of the wave forms obtainable at the base electrodes (Fig. 1*a*) and at the collector electrodes (Fig. 1*b*) with those for a standard capacity-resistance vacuum tube multivibrator will show that they are exactly the same.

For one particular arrangement that was found to produce the desired results the battery 25 was of 2.5 volts, resistances 21 and 22 each were of 15,000 ohms, resistances 26 and 27 were each of 22,000 ohms, and the inductances 23 and 24 were each of 1.5 henries. With this arrangement the frequency of the oscillations generated was a few hundred cycles per second. It will be understood, of course, that this frequency could be varied by making corresponding elements adjustable.

Figure 2:
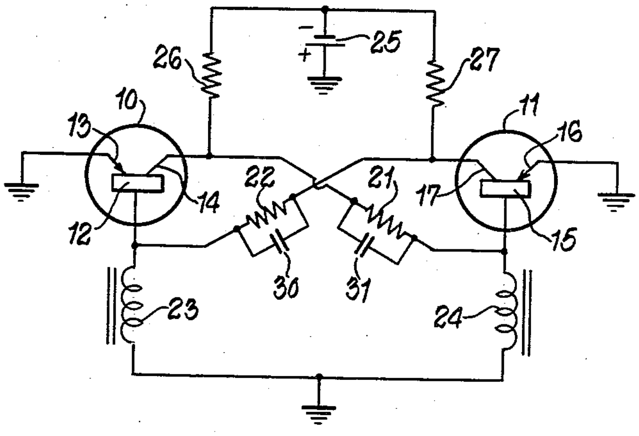
Fig. 2 is a modification of Fig. 1.

In order to speed up the transition from one state to the other, condensers 30, 31, may be placed across the resistors 21 and 22. Such an arrangement is shown in Fig. 2. It will be understood, of course, that throughout the various figures of the drawing the same numerals are used to designate the same or similarly functioning elements. The condensers 30 and 31 have the effect of steepening the rise of the leading edge of each wave and also increasing the maximum potential of these waves by as much as 50%.

Instead of connecting condensers 30 and 31 across the resistors 21 and 22, these condensers may be connected across the inductances 23 and 24. Such an arrangement is shown in Fig. 3. These condensers prevent the sharp potential swings across the coils 23 and 24 and actually smooth out the wave forms so that the wave form produced between the base electrodes 12 and 15 is approximately a sine wave, as shown in Fig. 3*a*. On the other hand, the wave shape obtainable at the collector electrodes 14 and 16 is substantially square in wave shape, as indicated in Fig. 3*b*.

Instead of employing two condensers, a single condenser can be connected directly between the base electrodes 12 and 15. Such an arrangement is shown in Fig. 4. This arrangement gives rise to the sinusoidal wave forms and the square topped wave forms such as those of Figs. 3*a* and 3*b* respectively.

Fig. 5 shows a modification of the invention in which the base electrodes 12 and 15 are interconnected by means of a transformer winding 32, whose mid-point is grounded. In effect, therefore, the two halves of the winding 32 are in inductive relationship and react on each other to produce the necessary regenerative effect. The arrangement of Fig. 5 produces at the output of the system, for example at the output winding 34 of the transformer 33, a square wave with a very long period, as shown in Fig. 6. In one particular arrangement, according to Fig. 5, the transformer 33 provided impedance between the base electrodes 12 and 15 of approximately 80,000 ohms at 1,000 cycles and the periodicity of the square wave output was approximately 3 seconds. This arrangement enables the obtaining of very slow oscillations or square waves with reasonably small sized circuit components.

The arrangement of Fig. 5 was also made to operate at 15 cycles per second with another transformer which provided an impedance from electrode 12 to 15 of approximately 15,000 ohms with 1,000 cycles. This is equivalent to an inductance of about 2.5 henries. In this arrangement the potential of the battery 25 was 7 volts and the resistances 21, 22, 26, 27, had the same values as in Fig. 1.

Fig. 7 shows a modification of Fig. 6 as an alternative method of obtaining square wave output. The nature of the wave output is shown in Fig. 8. In this embodiment the base electrodes 12, 15, are returned to ground through the resistances 35, 36, each of approximately 1,000 ohms, and the collector electrodes 14 and 15 are connected through the negative biasing battery 25 to ground by means of the transformer winding 32, whose output winding 34 provides the wave shape shown in Fig. 8. The transformer 33 in Fig. 7, was the same transformer as in Fig. 5. The resistances 21, 22, also had the same values as the corresponding resistors of Fig. 5, namely approximately 15,000 ohms. In this arrangement the battery 25 was a 1 volt battery. With this arrangement, the frequency of the square wave output taken off the winding 34 is shown in Fig. 8. The frequency of the output oscillations in Fig. 7 can be changed by connecting a condenser across the transformer winding 32, but this does not substantially change the output wave shape.

It will be understood that the invention is not limited to any particular type of transistor. Thus, there is shown in Fig. 9 a multiple junction transistor comprising a pair of N-type germanium bodies 18, 19, between which is provided a P–type germanium barrier layer 20. It will be understood, of course, that the reverse kinds of materials may be used in the junction, for example the germanium bodies 18 and 19 may be of P-type germanium and the barrier layer 20 may be of N-type germanium. A large area ohmic contact 13 is attached to germanium member 18 and a large area ohmic contact member 14 is attached to germanium member 19. The barrier layer 12 is provided with a separate contact and constitutes the base electrode of the transistor. The electrode 13 constitutes the emitter electrode, and the electrode 14 constitutes the collector electrode. Other well-known types of junction transistors can be used.

Various changes and modifications may be made in the disclosed embodiment without departing from the spirit and scope of the invention.

What is claimed is:

1. A multivibrator comprising a pair of transistors, a common ground return for all the electrodes of both transistors, a first resistance cross-connecting the collector electrode of the first transistor with the base electrode of the second transistor, a second resistor cross-connecting the collector electrode of the second transistor with the base electrode of the first transistor, inductance means connected between the base electrodes of both transistors, a direct current potential source for polarizing the collector electrodes of both transistors with respect to their base electrodes, said source having one terminal connected to ground and the other terminal connected in parallel to the said collector electrodes, means connecting the emitters of both transistors directly to ground, said inductance means and said resistances forming an oscillatory circuit having a predetermined time constant for controlling regenerative feed-back between the transistors.

2. A multivibrator according to claim 1 in which said potential source has one pole grounded and the opposite pole is connected in parallel through respective additional resistors to the collector electrodes of the transistors.

3. A multivibrator according to claim 1 in which said first and said second resistor are each shunted by a condenser.

4. A multivibrator comprising a first transistor, a second transistor, first resistance means cross-connecting the collector electrode of the first transistor with the base electrode of the second transistor, second resistance means cross-connecting the collector electrode of the second transistor with the base electrode of the first transistor, a polarizing source of direct current potential having one terminal connected in parallel to the collector electrodes of the transistors, the opposite terminal of said source being grounded, and a transformer having its primary winding bridged directly across the base electrodes of both transistors and with its electrical mid-point connected to ground, and the emitter electrodes of both transistors being directly grounded.

5. A multivibrator comprising a first transistor, a second transistor, a first resistance means cross connecting the collector electrode of the first transistor to the base electrode of the second transistor, second resistance means cross connecting the collector electrode of the second transistor to the base electrode of the first transistor, means connecting the base electrodes of the transistors through respective resistances to ground, a source of direct current polarizing potential having one pole grounded, the opposite pole of said source being connected to the mid-point of an inductance whose terminals are connected respectively to the collector electrodes of both transistors, the emitter electrodes of both transistors bein directly grounded.

6. A multivibrator according to claim 1, in which said inductance means comprises a pair of coils each connected between the base electrode of a respective transistor and ground, and a condenser shunting each of said coils separately.

7. A multivibrator according to claim 1, in which said inductance means comprises a pair of coils each connected between a base electrode of a respective transistor and ground, and a condenser bridging the ungrounded ends of said coils.

8. A multivibrator according to claim 1, in which said inductance means comprises a winding of an audio-frequency transformer, the mid point of which is connected to ground.

References Cited in the file of this patent

UNITED STATES PATENTS

| | | |
|---|---|---|
| 2,531,076 | Moore | Nov. 21, 1950 |
| 2,569,345 | Shea | Sept. 25, 1951 |
| 2,620,448 | Wallace | Dec. 2, 1952 |
| 2,663,806 | Darlington | Dec. 22, 1953 |